(12) United States Patent
Fricke et al.

(10) Patent No.: US 7,816,722 B2
(45) Date of Patent: Oct. 19, 2010

(54) MEMORY ARRAY

(75) Inventors: Peter J. Fricke, Corvallis, OR (US); Andrew L. Van Brocklin, Corvallis, OR (US); Warren B. Jackson, San Francisco, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/772,945

(22) Filed: Feb. 4, 2004

(65) Prior Publication Data

US 2005/0167787 A1 Aug. 4, 2005

(51) Int. Cl.
 H01L 29/76 (2006.01)
(52) U.S. Cl. .................. 257/314; 257/209; 257/646
(58) Field of Classification Search .......... 257/202, 257/209, 211, 390, 314–326, 635, 645, 646, 257/651
 See application file for complete search history.

(56) References Cited

U.S. PATENT DOCUMENTS

| 4,363,110 | A |   | 12/1982 | Kalter et al. |
| 4,432,072 | A |   | 2/1984 | Chao et al. |
| 4,446,535 | A |   | 5/1984 | Gaffney et al. |
| 4,471,471 | A |   | 9/1984 | DiMaria |
| 4,476,547 | A | * | 10/1984 | Miyasaka .................. 365/205 |
| 4,688,078 | A |   | 8/1987 | Hseih |
| 4,717,943 | A | * | 1/1988 | Wolf et al. .................. 257/324 |
| 4,752,812 | A |   | 6/1988 | Arienzo et al. |
| 4,870,470 | A | * | 9/1989 | Bass et al. .................. 257/324 |
| 5,196,722 | A | * | 3/1993 | Bergendahl et al. ......... 257/304 |
| 5,258,643 | A |   | 11/1993 | Cohen |
| 5,298,447 | A |   | 3/1994 | Hong |
| 5,331,189 | A |   | 7/1994 | Chan et al. |
| 5,451,535 | A |   | 9/1995 | Chan et al. |
| 5,468,663 | A |   | 11/1995 | Bertin et al. |
| 5,481,128 | A |   | 1/1996 | Hong |
| 5,617,351 | A |   | 4/1997 | Bertin et al. |
| 5,656,837 | A | * | 8/1997 | Lancaster et al. ........... 257/314 |
| 5,811,870 | A |   | 9/1998 | Bhattacharyya et al. |
| 6,344,373 | B1 |  | 2/2002 | Bhattacharyya et al. |
| 6,549,447 | B1 |  | 4/2003 | Fricke et al. |
| 6,834,008 | B2 | * | 12/2004 | Rinerson et al. ............ 365/158 |
| 6,881,994 | B2 | * | 4/2005 | Lee et al. .................... 257/296 |

(Continued)

FOREIGN PATENT DOCUMENTS

WO 95/30244 A 11/1995

(Continued)

OTHER PUBLICATIONS

Dimaria et al., "Enhanced conduction and minimized charge trapping in electrically alterable read-only memories using off-stoichiometric silicon dioxide films" J. Appl. Phys. 55 (8), Apr. 15, 1984, pp. 3000-3019.

(Continued)

*Primary Examiner*—Ori Nadav

(57) ABSTRACT

A memory array has a multiplicity of row conductors and a multiplicity of column conductors, the row conductors and column conductors being arranged to cross at cross-points, and has a memory cell disposed at each cross-point, each memory cell having a storage element and a control element coupled in series between a row conductor and a column conductor, and each control element including a silicon-rich insulator. Methods for fabricating the memory array are disclosed.

31 Claims, 9 Drawing Sheets

U.S. PATENT DOCUMENTS

| | | | |
|---|---|---|---|
| 6,903,425 B2 * | 6/2005 | Tang et al. | 257/376 |
| 7,012,297 B2 * | 3/2006 | Bhattacharyya | 257/317 |
| 2002/0028541 A1 | 3/2002 | Lee et al. | |
| 2003/0042534 A1 | 3/2003 | Bhattacharyya | |
| 2003/0072126 A1 | 4/2003 | Bhattacharyya | |
| 2003/0081446 A1 | 5/2003 | Fricke et al. | |
| 2003/0151948 A1 | 8/2003 | Bhattacharyya | |
| 2003/0161175 A1 | 8/2003 | Fricke et al. | |
| 2003/0178693 A1 | 9/2003 | Bhattacharyya et al. | |
| 2003/0183870 A1 | 10/2003 | Sugiyama | |
| 2003/0185048 A1 | 10/2003 | Fricke et al. | |
| 2003/0189851 A1 | 10/2003 | Brandenberger et al. | |
| 2005/0012126 A1 * | 1/2005 | Udayakumar et al. | 257/295 |

FOREIGN PATENT DOCUMENTS

| | | |
|---|---|---|
| WO | 03/038907 A | 5/2003 |

OTHER PUBLICATIONS

Dimaria et al., "Enhanced storage dynamic cell using composite silicon-richSiO2 and thermal SiO2 layers" IBM Tech. Discl. Bull., Mar. 1984, pp. 5380-5383.

Dimaria et al., "Use of composite silicon-rich SiO/2/ and SiO/2/ layers or off-stoichiometric CVD SiO/2/ layers for improvement of poly 1 to poly 2 dielectric" IBM Tech. Discl. Bull., May 1983, p. 6417.

H. Chao "Electrically alterable read-only memory array" IBM Tech. Discl. Bull., Jun. 1982, pp. 41-43.

Dimaria et al., "Electrically-Alterable Memory Using a Dual Electron Injector Structure," Electron Dev. Let. , EDL-1 (9), Sep. 1980, pp. 179-181.

Dimaria et al. "Two carrier dual injector structur ," IBM Tech. Discl. Bull., Aug. 1980, pp. 1277-1279.

Dimaria et al. "Dual electron injector structure" Appl. Phys. Lett. 37(1), Jul. 1, 1980, pp. 61-64.

Dimaria et al. "High current injection into SiO2 from Si rich SiO2 films and experimental applications," J. Appl. Phys., 51(5), May 1980, pp. 2722-2735.

Dimaria et al. "High current injection into SiO2 using Si-rich SiO2 films and xperimental applications," in "The Physics of MOS Insulators" (G. Lucovsky et al., Eds.) P rgamon Press, New York, 1980.

Dimaria D.J et al, "Dense Alpha Particle-Immune Memory Device", IBM Tech Disclosure Bulletin, V23(1). Jun. 1980, pp. 381-382.

Aceves, M et al, "The Conduction Properties of the Silicon/Off-Stoichiometry-SiO2 Diode", Solid State Electronic, V.39 (5), May 1996, pp. 637-644.

* cited by examiner

MEMORY ARRAY

CROSS-REFERENCE TO RELATED APPLICATION

This application is related to co-pending and commonly assigned U.S. application Ser. No. 10/867,307, filed Jun. 14, 2004, the entire disclosure of which is Incorporated herein by reference.

TECHNICAL FIELD

This invention relates generally to arrays of memory devices and methods for their fabrication.

BACKGROUND

Markets for computers, video games, televisions, portable telephones, PDAs and other electrical devices are requiring increasingly larger amounts of memory to store images, photographs, videos, movies, music, and other storage-intensive data. At the same time, as computer and other electrical equipment prices continue to drop, the manufacturers of storage devices, such as memory devices and hard drives, need to lower the cost of their components. Thus, in addition to the need to increase the storage density of their devices, manufacturers of storage devices must also reduce costs. This trend of increasing memory storage density while reducing the fabrication costs of the storage has been on-going for many years. There is accordingly a need for economical, high capacity memory structures and economical methods for fabricating such structures, especially methods that are compatible with methods used to fabricate other elements of integrated circuits.

Integrated circuits including arrays of memory nodes or logic gates have also increased steadily in density. Such integrated circuits have included dynamic random access memory (DRAM) devices, static random access memory (SRAM) devices, programmable read-only memory (PROM) integrated circuits, electrically erasable programmable read-only memory (EEPROM) integrated circuits, write-once read-many (WORM) memory devices, and logic devices such as programmable logic array (PLA) integrated circuits, among others.

For controlling write and read operations of multi-layer memory arrays, a control element is generally associated with each memory cell of the array. In many cases, such control elements have required excessive power and have limited array performance. In some cases, the driver circuits for such control elements have required relatively large areas, accounting for about half of the array size.

Tunnel-junction control elements using selected area ratios have required smaller areas, but have required additional mask steps for their fabrication, and have suffered yield losses due to mismatches of tunnel junctions, thus increasing costs.

When the sense lines within a memory array are each connected to a selected memory cell and to many other unselected memory cells, and the unselected memory cells are also connected to unselected bit lines, the many parallel paths through the unselected memory cells from a sense line to the unselected bit lines are generally referred to as "sneak paths." Thus, currents that flow through the sneak paths (i.e., "sneak-path currents") have occurred in some arrays, adversely affecting the performance of read operations.

Three-terminal memory cell devices, having a gate electrode for controlling the state of the memory cell, are known. Many of these are "flash" devices, which utilize current injection into floating gates. In a typical flash memory, each of the memory cells includes a floating-gate field-effect transistor capable of holding a charge, and the data stored in a cell is determined by the presence or absence of the charge in the floating gate. Other three-terminal memory cell devices employ Metal-Oxide-Nitride-Oxide-Silicon (MONOS) structures or Silicon-Oxide-Nitride-Oxide-Silicon (SONOS) structures in which a gate insulating layer between a channel region and a control gate includes a laminated portion consisting of a silicon oxide layer, a silicon nitride layer, and another silicon oxide layer, and in which the silicon nitride layer traps electric charges. While these memory devices perform their intended functions, there is an on-going need for economical high-yield methods for fabricating memory structures, including memory arrays, especially memory arrays with reduced susceptibility to sneak-path currents.

BRIEF DESCRIPTION OF THE DRAWINGS

The features and advantages of the disclosure will readily be appreciated by persons skilled in the art from the following detailed description when read in conjunction with the drawings, wherein.

DETAILED DESCRIPTION OF EMBODIMENTS

Figure 1:
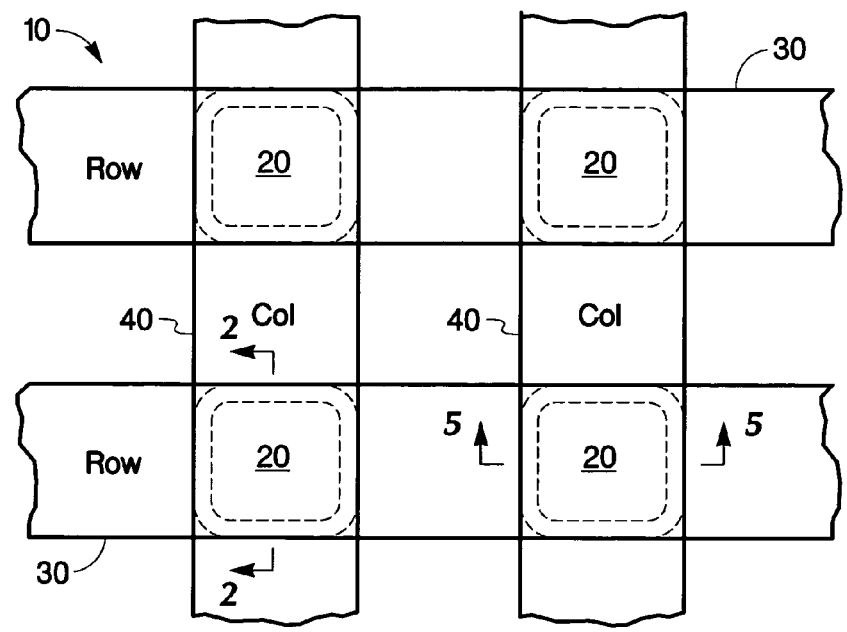
FIG. 1 is a top plan view of an embodiment of a crosspoint memory array.

For clarity of the description, the drawings are not drawn to a uniform scale. In particular, vertical and horizontal scales may differ from each other and may vary from one drawing to another. In this regard, directional terminology, such as "top," "bottom," "front," "back," "leading," "trailing," etc., is used with reference to the orientation of the drawing figure(s) being described. Because components of the invention can be positioned in a number of different orientations, the directional terminology is used for purposes of illustration and is in no way limiting.

Integrated circuits having arrays of devices, gates, or memory nodes disposed on multiple levels require "vertical" interconnections or "pillars" to interconnect devices, gates, or memory nodes on one level with other devices, gates, or nodes on other levels. In this context, the term "vertical" differs from its everyday connotation in that it does not refer to the direction of gravity. Throughout this specification, the drawings, and the appended claims, the term "vertical" refers to a direction generally perpendicular to a substrate or base plane of an integrated circuit. Also, the term "pillar" referring to an interconnection and the term "vertical interconnection" are used interchangeably to mean an interconnection communicating between different layers of an integrated circuit, regardless of the spatial orientation of those different layers. Integrated circuits herein include not only monolithic integrated circuits, but also hybrid integrated circuits and multilayer or "stacked" modules. The term "cell" herein refers to a functional element of an array, such as a memory node, a logic gate, a switching device, a field-effect device, or a semiconductor device.

According to one aspect of the embodiments of the invention, a memory array has a number of row conductors and a number of column conductors, the row conductors and column conductors being arranged to cross at cross-points, and the memory array has a memory cell disposed at each cross-point, as shown in FIG. 1, each memory cell having a storage element and a control element coupled in series between a row conductor and a column conductor, and each control element including a silicon-rich insulator. The silicon-rich insulator (e.g. silicon-rich oxide) may be patterned. FIG. 1 is a top plan view of an embodiment of such a crosspoint memory array 10, with a memory cell 20 at each cross-point, row conductors 30, and column conductors 40 intersecting the row conductors at each memory cell 20. As shown in FIG. 1, the row conductors 30 may be arranged in mutually orthogonal relationship with the column conductors 40. Memory cell 20 may be a write-once/read-many device.

Figure 2:
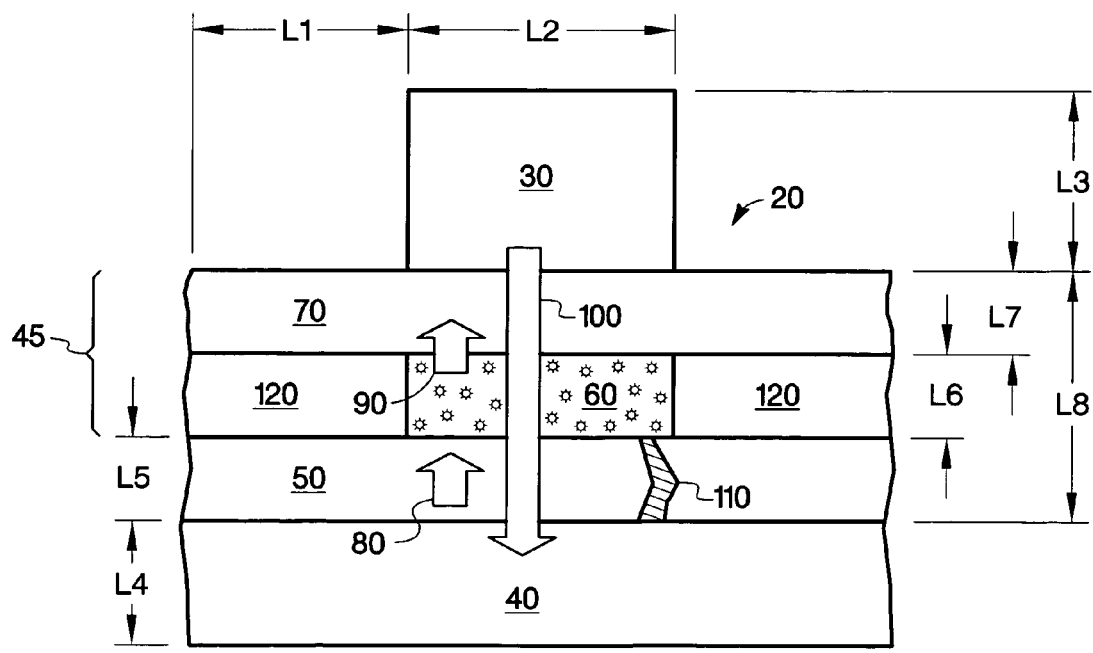
FIG. 2 is a cross-sectional side elevation view of a first embodiment of a memory cell.

Another aspect of the embodiments provides a memory array 10 in which the control element of each cell includes a tunnel junction in addition to the silicon-rich insulator, as shown in FIG. 2. The storage element of each cell may comprise, for example, an anti-fuse, a tunnel junction, or a state-change layer. Specifically, when the storage element comprises a state-change layer, the state-change layer of such a storage element may comprise a chalcogenide.

Figure 3:
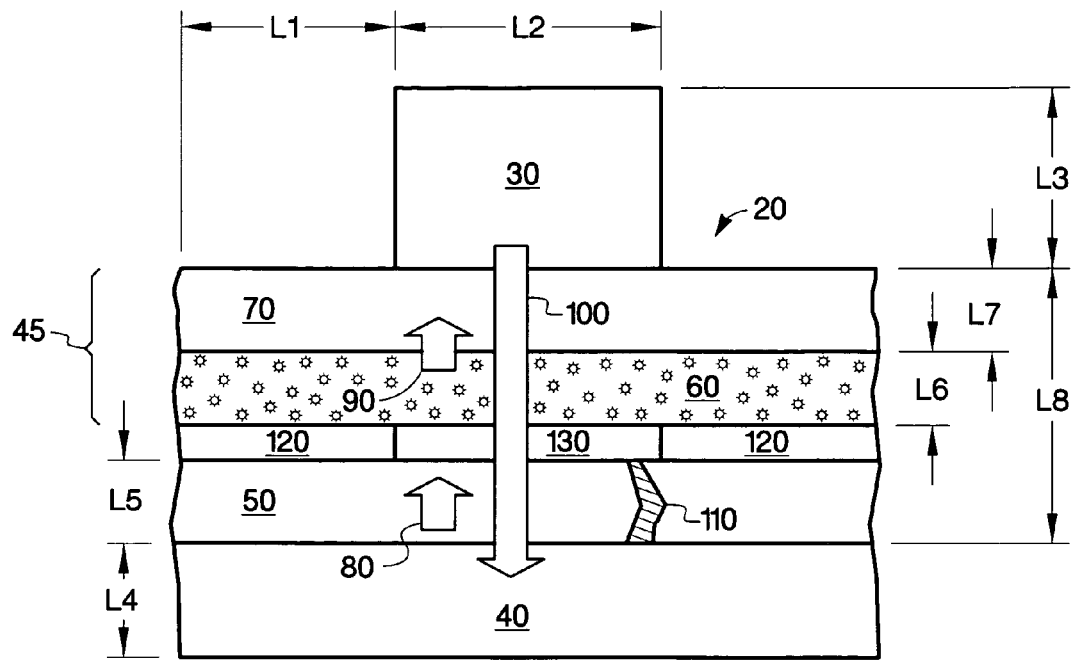
FIG. 3 is a cross-sectional side elevation view of a second embodiment of a memory cell.
Figure 4:
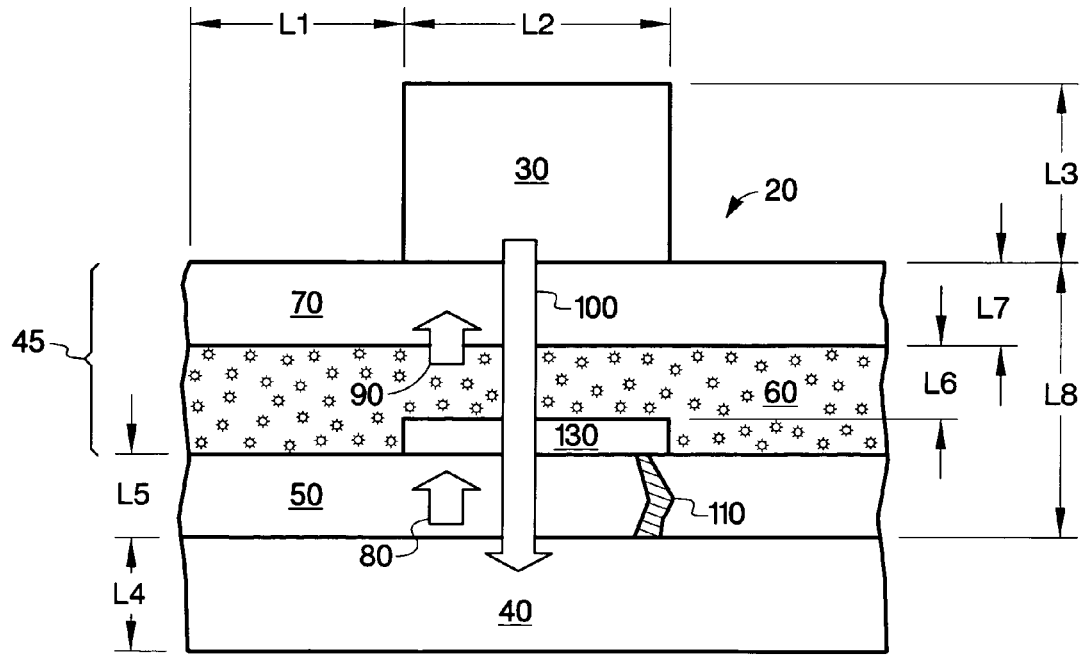
FIG. 4 is a cross-sectional side elevation view of a third embodiment of a memory cell.

Various embodiments of memory cell 20 are shown in FIGS. 2-8. The cross-sectional views of FIGS. 2, 3, and 4 are all taken at the plane indicated in FIG. 1 for FIG. 2. Dimensions L1-L8 in the drawings are explained below in the section titled "FABRICATION."

FIG. 2 is a cross-sectional side elevation view of an embodiment of a memory cell 20. In the embodiment of FIG. 2, column conductor 40 extends to the left and right, parallel to the plane of the drawing. Row conductor 30 extends in a direction perpendicular to the plane of the drawing. The projected intersection of the row and column conductors generally defines the area of memory cell 20 disposed at that intersection. In the embodiment shown in FIG. 2, storage element 50 may be a tunnel junction or a state-change layer such as a chalcogenide layer. In this embodiment, the control element (coupled in series with the storage element) consists of silicon-rich insulator 60 and tunnel junction 70. Arrow 80 shows the direction of storage-element electron flow. Arrow 90 shows the direction of control-element electron flow. Arrow 100 shows the direction of programming current. As shown in FIG. 2, silicon-rich insulator 60 may be patterned. An optional layer of interlayer dielectric 120 deposited and then planarized to the top of silicon-rich insulator 60 may be used to provide insulation between the individual regions of silicon-rich insulator 60 in various memory cells. Thus, the patterned silicon-rich insulator 60 of each memory cell is electrically isolated from the patterned silicon-rich insulators of all other memory cells. Alternatively, layer 120 can be omitted and layer 70 serves as the insulator between laterally adjacent patterned silicon-rich insulators 60.

It is not necessary to pattern storage layer 50 and control element tunnel-junction layer 70, since they effectively have infinite resistance between cross-points. Silicon-rich insulator layer 60 is a voltage-dependent conductive layer, ideally patterned to avoid the necessity of a constraint on voltage across it between cross-points. However, it can be optionally un-patterned, if the electric potential across it between cross-points is constrained in the application to be below a specified voltage threshold of conduction.

Thus, another aspect of the embodiments is a memory array 10 including a number of row conductors 30 and a number of column conductors 40 arranged to cross at cross-points, and including a memory cell 20 disposed at each cross-point, each memory cell having a storage element 50 and a control element 45 coupled in series between a row conductor and a column conductor. Each storage element 50 comprises a tunnel-junction anti-fuse or a state-change layer such as a chalcogenide layer. Each control element 45 comprises a silicon-rich insulator 60 (optionally patterned) and a tunnel junction 70. The silicon-rich insulator 60 of the control element 45 injects current into the tunnel junction 70 of the control element when the memory cell 20 is selected and isolates the storage element 50 when the memory cell 20 is unselected. Silicon-rich insulator 60 may be considered an electronic switch that allows selection of the memory cell for programming and sensing of the storage state, as well as isolation of the memory cell when the memory cell is unselected.

The layer 60 of silicon-rich oxide (SRO) of the control element 45 provides for enhanced current injection into the dielectric of tunnel junction layer 70. Current injection from SRO is described in the paper by D. J. DiMaria et al., J. Appl. Phys. V. 51(15), May 1980, pp. 2722-2735; in the paper by D. J. DiMaria et al., J. Appl. Phys. V. 55(8), Apr. 15, 1984, pp. 3000-3019; and in the chapter by D. J. DiMaria, "High Current Injection Into $SiO_2$ Using Si-rich $SiO_2$ Films and Experimental Applications" in "The Physics of MOS Insulators," (G. Lucovsky et al., Eds.) Pergamon Press, New York, 1980, pp. 1-18. The entire disclosure of each of these three publications is incorporated herein by reference.

One effect of the silicon-rich-insulator control element of each memory cell is improved isolation and a resultant significant reduction of cumulative sneak-path currents that might otherwise occur when a row of the memory array is driven. This improved isolation, in turn, allows elimination of very large row-driver circuits, saving up to half of the memory area previously dedicated to row drivers. Each memory cell is electrically isolated from the patterned silicon-rich insulators of all other memory cells. In addition, the size of sub-arrays is substantially increased, which reduces overall overhead for memory array support circuitry. Patterning the memory cell can maximize the achievable array size and can minimize support-circuit overhead costs. This patterning can be achieved with a reduced number of masks or without additional masks, thus lowering fabrication costs. Stacked memory-array layers may be fabricated without destroying lower-layer memory cell structures and lower-layer metal lines. Furthermore, a large part of the area under the array can be utilized for CMOS control circuits, as described below in connection with the discussion of FIG. 11.

In comparison with previous solutions, other advantages provided by the use of a silicon-rich insulator include higher currents at the low voltages needed for lower voltage devices and higher current densities which are particularly useful with devices having dimensions below 0.5 micrometer. In addition, the silicon-rich insulator can act like a control element due to its asymmetric rectification characteristic.

Within the control element of the present invention, current injection from the silicon-rich insulator allows the use of thicker oxide, so that fewer defects occur and yield is improved. Also, the breakdown voltage of the control element is improved, significantly reducing the probability of control element failure due to an over-voltage condition that can occur when an anti-fuse changes state.

When storage element 50 is a tunnel-junction oxide or a state-change layer such as a chalcogenide layer, data may written into memory cell 20 by forming a low-resistance filament 110, shown schematically in FIGS. 2-7. While a stylized schematic depiction of low-resistance filament 110 is shown in several embodiments, its shape or its presence in these drawings should not be regarded as limiting the invention. Otherwise similar embodiments which do not form such a filament are also operable in accordance with the present invention.

FIG. 3 is a cross-sectional side elevation view of a second embodiment of a memory cell. In this embodiment, it is not necessary that silicon-rich insulator layer 60 be patterned, though it may be patterned if desired. A patterned conductive middle electrode 130 effectively determines the portion of silicon-rich insulator layer 60 that participates in operation of the memory cell. The patterned conductive middle electrodes 130 of different adjacent memory cells are insulated from each other by interlayer dielectric (ILD) 120. In this embodiment, middle electrode 130 is disposed between storage element 50 and silicon-rich insulator layer 60.

FIG. 4 is a cross-sectional side elevation view of a third embodiment of a memory cell. This embodiment is similar to the embodiment of FIG. 3 in that it has a patterned conductive middle electrode 130, but this embodiment omits the interlayer dielectric 120. The silicon-rich insulator 60 insulates different memory cells at adjacent cross-points from each other. In this embodiment, middle electrode 130 is disposed generally between storage element 50 and silicon-rich insulator layer 60 by virtue of being embedded in the bottom portion of the latter. In a variation on the embodiment of FIG. 4, the silicon-rich insulator layer 60 may also be patterned, similarly to the configuration shown in the embodiment of FIG. 2. Also, as in FIG. 2, an interlayer dielectric 120 may be used in conjunction with the patterned silicon-rich insulator layer 60.

Figure 5:
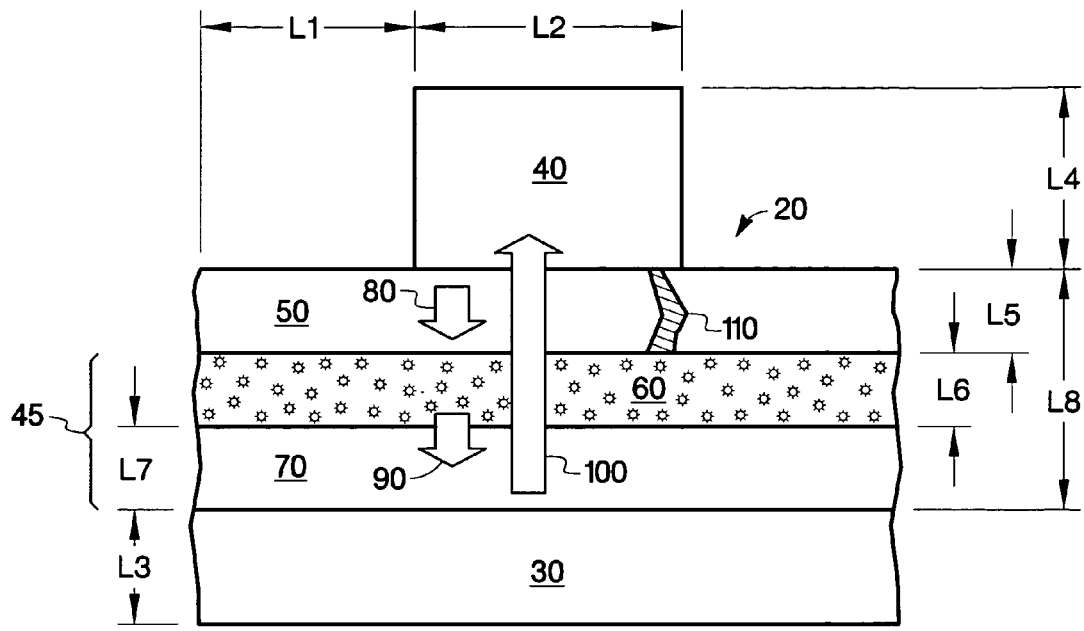
FIG. 5 is a cross-sectional side elevation view of a fourth embodiment of a memory cell.

The cross-sectional views of FIGS. 5, 6, 7, and 8 are all taken at the plane indicated in FIG. 1 for FIG. 5. FIG. 5 is a cross-sectional side elevation view of a fourth embodiment of a memory cell. This embodiment is similar in some respects to the embodiment of FIG. 4, but conductive middle electrode 130 is omitted in this embodiment. The directions of storage-element electron flow 80, control-element electron flow 90, and programming current 100 in this embodiment are reversed from those of FIGS. 2-4. Again, a related embodiment may include a patterned silicon-rich insulator layer 60 and may also include an interlayer dielectric 120 used in conjunction with the patterned silicon-rich insulator layer 60, as described in connection with FIG. 2.

Figure 6:
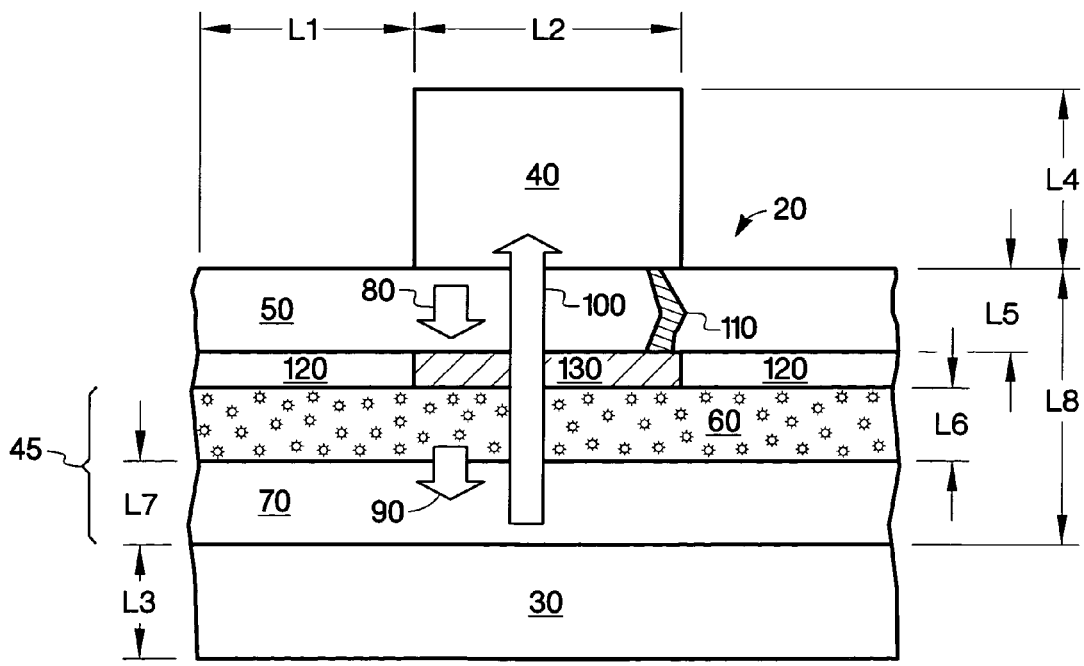
FIG. 6 is a cross-sectional side elevation view of a fifth embodiment of a memory cell.

FIG. 6 is a cross-sectional side elevation view of a fifth embodiment of a memory cell. In the embodiment shown in FIG. 6, conductive middle electrode 130 is disposed between silicon-rich insulator layer 60 and storage-element layer 50. The patterned conductive middle electrodes 130 of memory cells at adjacent cross-points are insulated from each other by interlayer dielectric (ILD) 120. The directions of storage-element electron flow 80, control-element electron flow 90, and programming current 100 in this embodiment and that of FIG. 7 are the same as in FIG. 5 (i.e., reversed from those of the embodiments shown in FIGS. 2-4).

Figure 7:
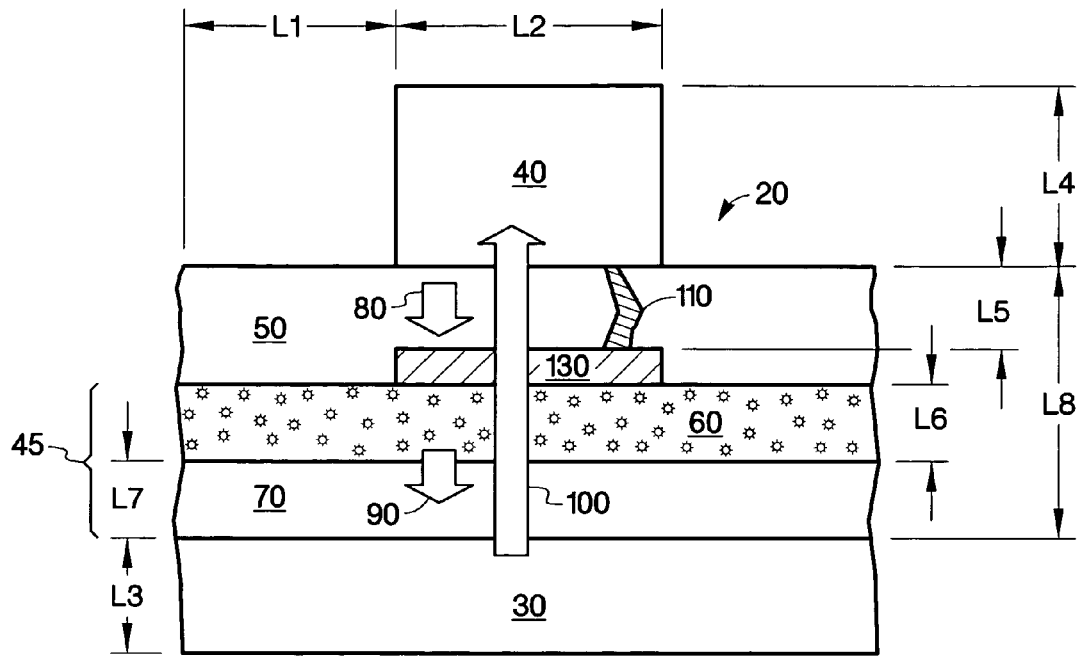
FIG. 7 is a cross-sectional side elevation view of a sixth embodiment of a memory cell.

FIG. 7 is a cross-sectional side elevation view of a sixth embodiment of a memory cell. This embodiment has a patterned conductive middle electrode 130 disposed between silicon-rich insulator layer 60 and storage-element layer 50, by virtue of being embedded in the bottom portion of the latter. As in all the embodiments of FIGS. 3-6, the embodiment of FIG. 7 may be modified in that the silicon-rich insulator layer 60 may also be patterned, similarly to the configuration shown in the embodiment of FIG. 2. Also, as in FIG. 2, an interlayer dielectric 120 may be used in conjunction with the patterned silicon-rich insulator layer 60.

Figure 8:
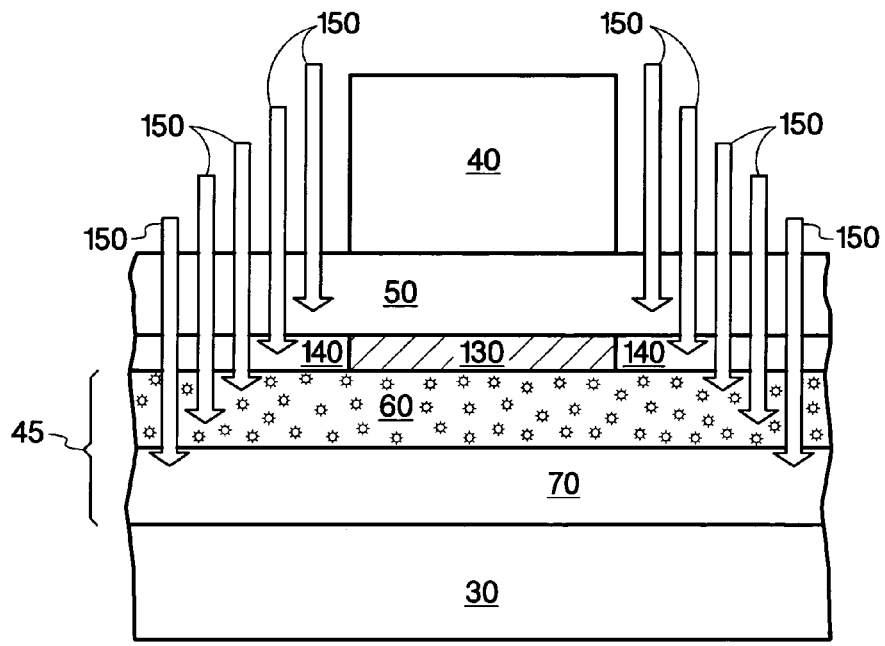
FIG. 8 is a cross-sectional side elevation view of a seventh embodiment of a memory cell.

FIG. 8 is a cross-sectional side elevation view of a seventh embodiment of a memory cell. This embodiment has a conductive middle electrode 130 formed by a final patterning step without a separate mask, thus eliminating a mask step in the fabrication of this embodiment. In the fabrication of this embodiment, a blanket conductive layer 130 is deposited over silicon-rich insulator layer 60, patterned with the row conductor 30 below it, and storage element layer 50 is deposited over the conductive layer 130. After column conductor 40 is deposited and patterned, a step of plasma oxidation is performed, using column conductor 40 as a hard mask and oxidizing the unmasked portions of the conductive layer 130 to form oxide regions 140. Arrows 150 illustrate schematically the oxygen plasma penetration through storage element layer 50.

The masked portions under column conductor 40 remain un-oxidized and thus remain conductive to form a patterned, isolated, middle electrode 130.

Figure 9:
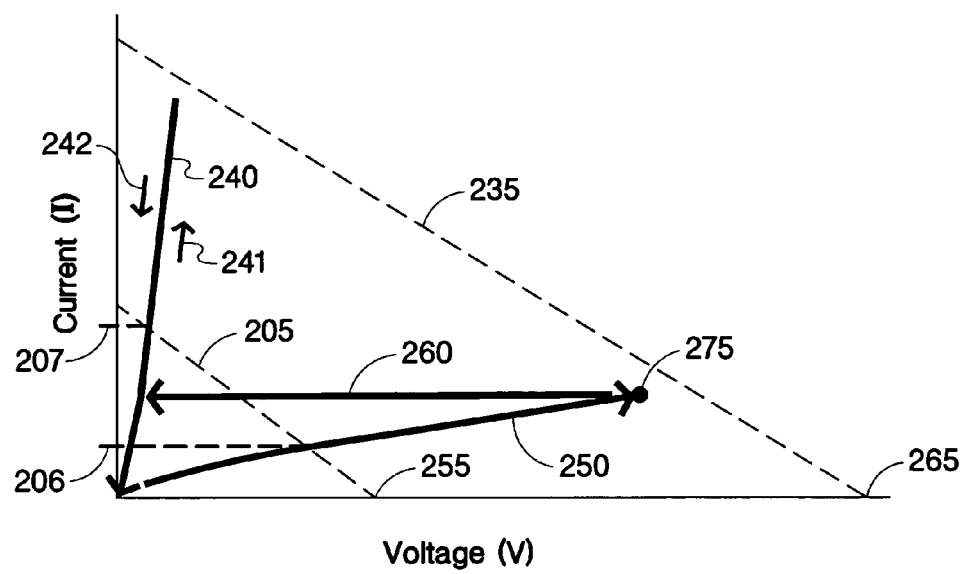
FIG. 9 is a graph of current/voltage relationships in an embodiment of a memory cell.

FIG. 9 is a graph of tunnel-junction current/voltage relationships in an embodiment of a memory cell. The vertical axis shows current, and the horizontal axis shows the tunnel-junction voltage. Read load line 205 and write load line 235 are shown as dashed lines which intersect the voltage axis at read voltage 255 and write voltage 265 respectively, as indicated along the voltage axis. The low-conductivity-state read current is indicated by horizontal dashed line 206. The high-conductivity-state read current is indicated by horizontal dashed line 207. As voltage across an un-fused (effectively open) tunnel-junction device is increased (curve 250), typically, the tunnel junction fuses at a switch point 275, whereupon a complete filament is formed and the current-voltage characteristic changes (arrow 260) to that of a fused (effectively shorted) device, shown by line 240. After a fusing event is completed, the current-voltage characteristic 240 of the fused tunnel-junction device falls within a fairly narrow sensing-voltage range. The two arrows 241 and 242 represent retrace of current along the current-voltage characteristic in the high-conductivity state. It should be noted that the high conductivity state retraces but the low conductance state does not; once the device switches, the current follows only the nearly vertical line 240. In those devices that are not switched, the current follows the leftmost portion of current-voltage characteristic 250.

Figure 10:
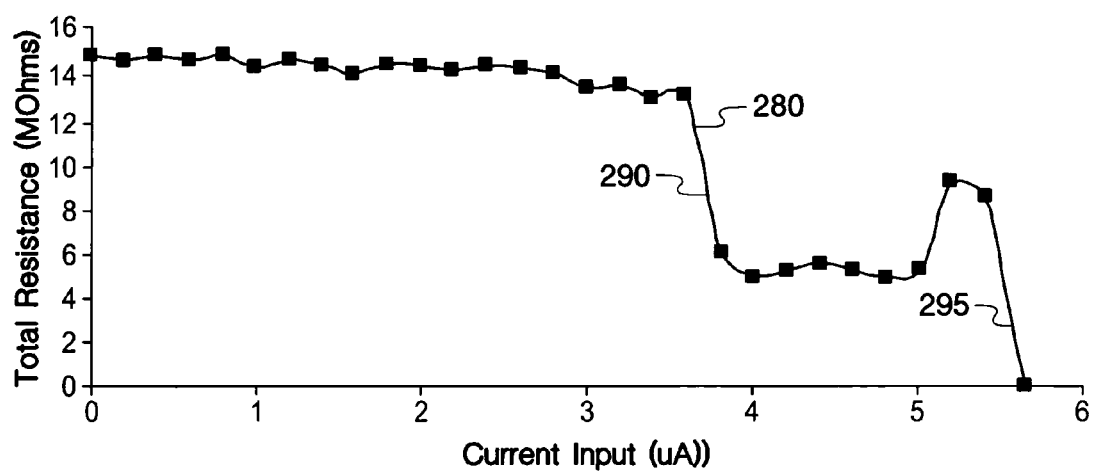
FIG. 10 is a graph of resistance vs. current in an embodiment of a memory cell.

Memory cell embodiments employing a control element with both a silicon-rich insulator and a tunnel junction are improved in uniformity and reliability over those with only a tunnel-junction control element. FIG. 10 is a graph of total resistance (Megohms) vs. current input in nanoamperes (nA) in an embodiment of a memory cell which has both a tunnel-junction control element and a tunnel-junction storage element. The plotted resistance 280 drops sharply upon anti-fuse breakdown 290 and drops further to zero upon breakdown 295 of the control-element tunnel junction. Thus, attention should be paid to over-voltage control. Memory cell embodiments using a tunnel-junction storage element and employing a control element with both a silicon-rich insulator and a tunnel junction are improved in breakdown resistance over those with only a tunnel-junction control element.

Figure 11:
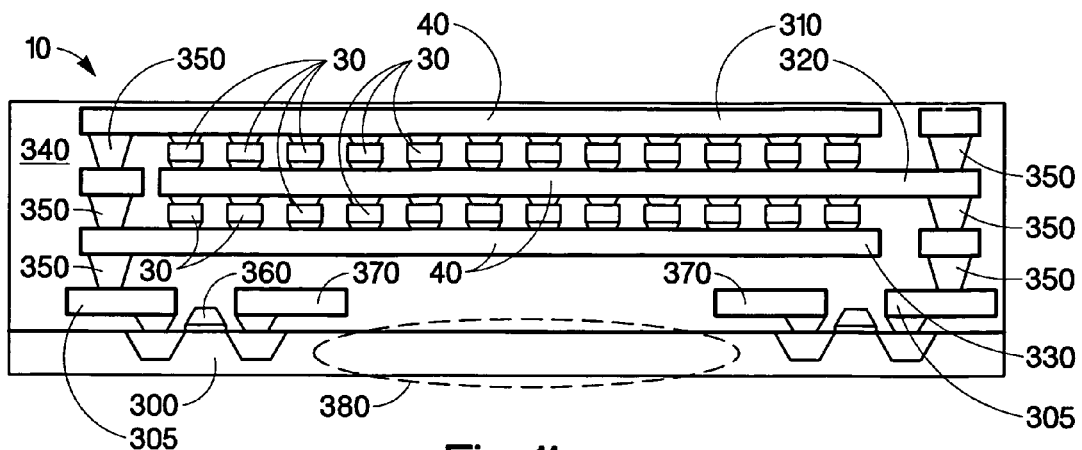
FIG. 11 is a cross-sectional side elevation overall view of an embodiment of a memory array.

FIG. 11 is a cross-sectional side elevation overall view of a simplified embodiment of a multi-layer memory array 10. In this embodiment, substrate 300 may be a wafer of P-type silicon suitable for CMOS circuit fabrication, for example. A first level (M1) of patterned metallization 305 provides conductive lines for connection to vias 350, for connection to control-select FET devices having control-select gates 360, and for connecting through conductive lines 370 to sense amplifiers (not shown in FIG. 11). In FIG. 11, column conductors 40 extend to left and right generally parallel to the plane of the drawing and row conductors 30 extend in the orthogonal direction generally perpendicular to the plane of the drawing. Three additional levels (e.g., second, third and fourth levels) of patterned metallization 310, 320, and 330 provide conductive lines for column conductors 40 and for connection to vias 350. Two other levels of patterned metallization between these provide the conductive lines for row conductors 30. Interlayer dielectric (ILD) 340 isolates adjacent levels and adjacent cross-points within each level of the multi-layer memory array 10. As indicated by dashed ellipse 380, the area under the array is available for CMOS circuits in addition to the control-select devices mentioned above. While FIG. 11 shows only a few rows and columns for clarity of illustration, in actual practice a subarray may include a minimum of 1,000 rows and 1,000 columns, and a memory may include many subarrays.

Figure 12:
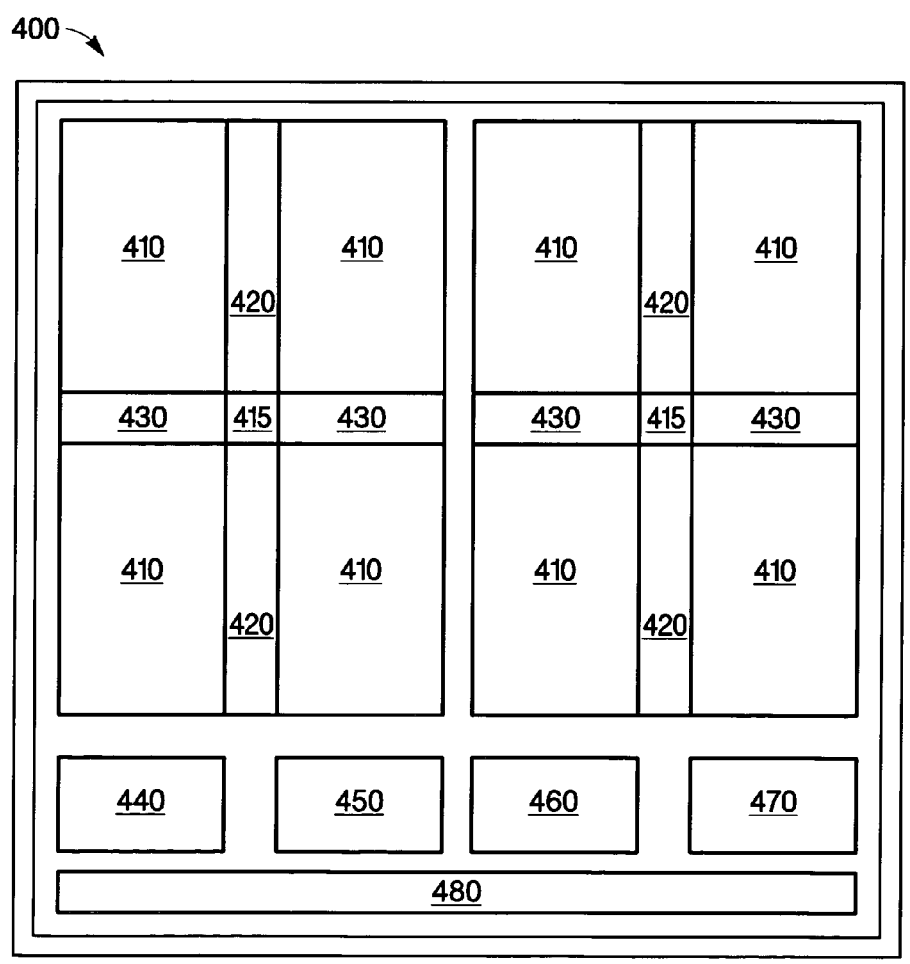
FIG. 12 is a top plan view illustrating an embodiment of a chip layout for a memory array.

FIG. 12 is a top plan view illustrating a simple embodiment of a chip layout or "floorplan" 400 for a memory array. A number of subarrays 410 may be arranged as shown, with control circuitry 415 near their adjacent corners. Row-enable drive circuitry 420 may be arranged between subarrays 410 along one direction, and column decode circuitry 430, including sense amplifiers, may be arranged along an orthogonal direction. Digital PLL circuitry 440, digital control logic 450, memory control 460, and voltage regulation 470 (if required) may be arranged as shown in FIG. 12 near interconnection pads 480 arranged along a chip edge. Many other layouts are possible.

Figure 13:
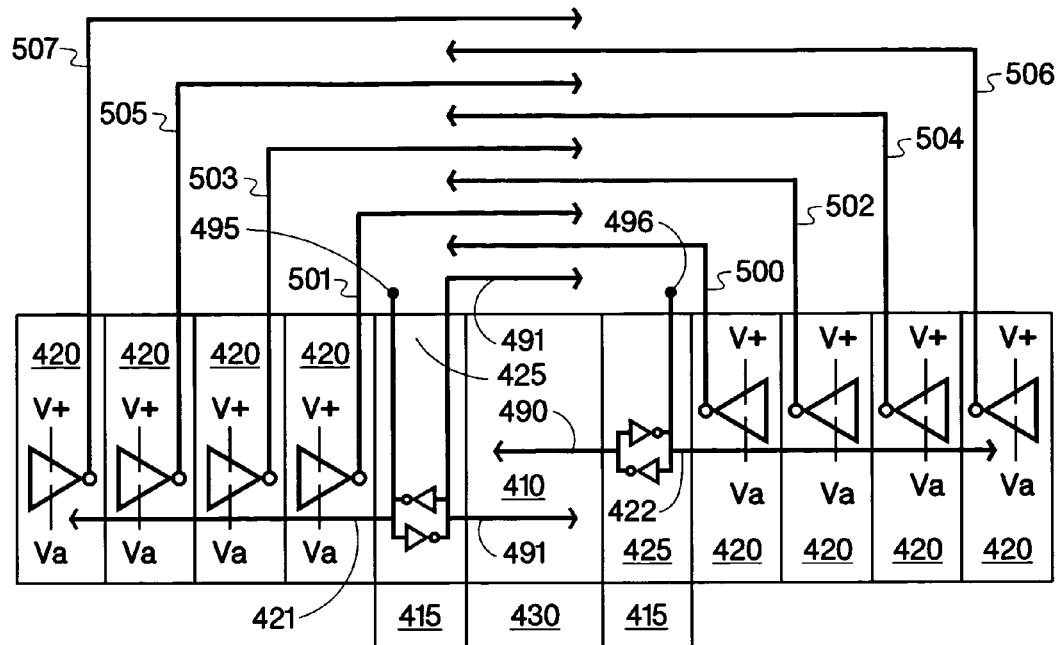
FIG. 13 is a schematic block diagram of an embodiment of a row configuration for a memory array.

FIG. 13 is a schematic block diagram of an embodiment of a row configuration for a memory array. Those skilled in the art will recognize that conventional details of row-enable drives 420 are omitted for clarity of illustration. Shown in FIG. 13 are row-enable lines 421 and 422, row-enable bit circuitry 425, bit-line-select lines 490 and 491 (alternating), bit-enable lines 495 and 496, and row levels 0-7 (respectively, 500-507).

Figure 14:
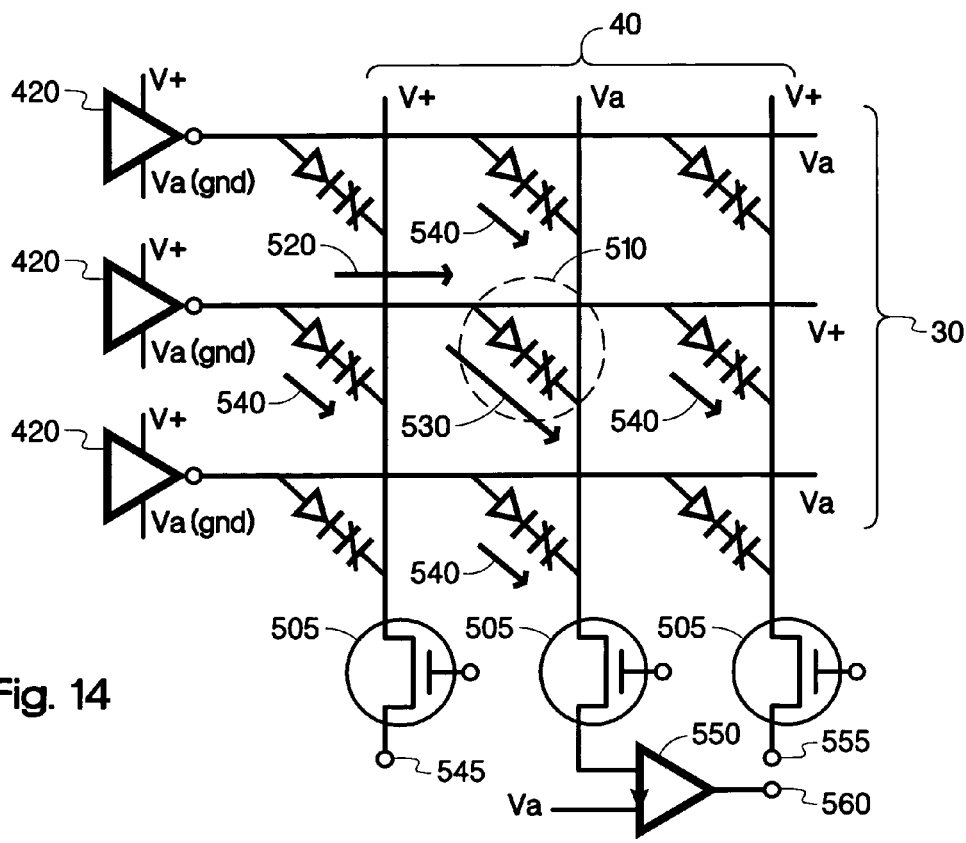
FIG. 14 is a simplified schematic diagram of an embodiment of a memory array, illustrating a write operation.

FIG. 14 is a simplified schematic diagram of an embodiment of a memory array, illustrating a write (programming) operation. In both FIGS. 14 and 15, the symbol enclosed in the dashed circles 510 and 610, and replicated at each cross-point, represents a memory cell comprising a series combination of a storage element and a control element, the latter including a tunnel junction and silicon-rich insulator. The cell enclosed in the dashed circle 510 is the cell which is being programmed. During a write operation, voltage V+ may be about two volts and voltage $V_a$ about 50 millivolts, for example. Arrow 520 represents row current for the row of that cell. The four arrows 540 represent current in cells of adjacent cross-points (e.g., about one microampere). FET devices 505 are column-select devices. The unselected columns in this example are connected at 545 and 555 to their own sense amplifiers (not shown). Sense amplifier 550 for the cell being programmed is connected to the write-pulse control 560. When the row and column for cell 510 are selected, program current 530 may be about 20 microamperes, for example.

Figure 15:
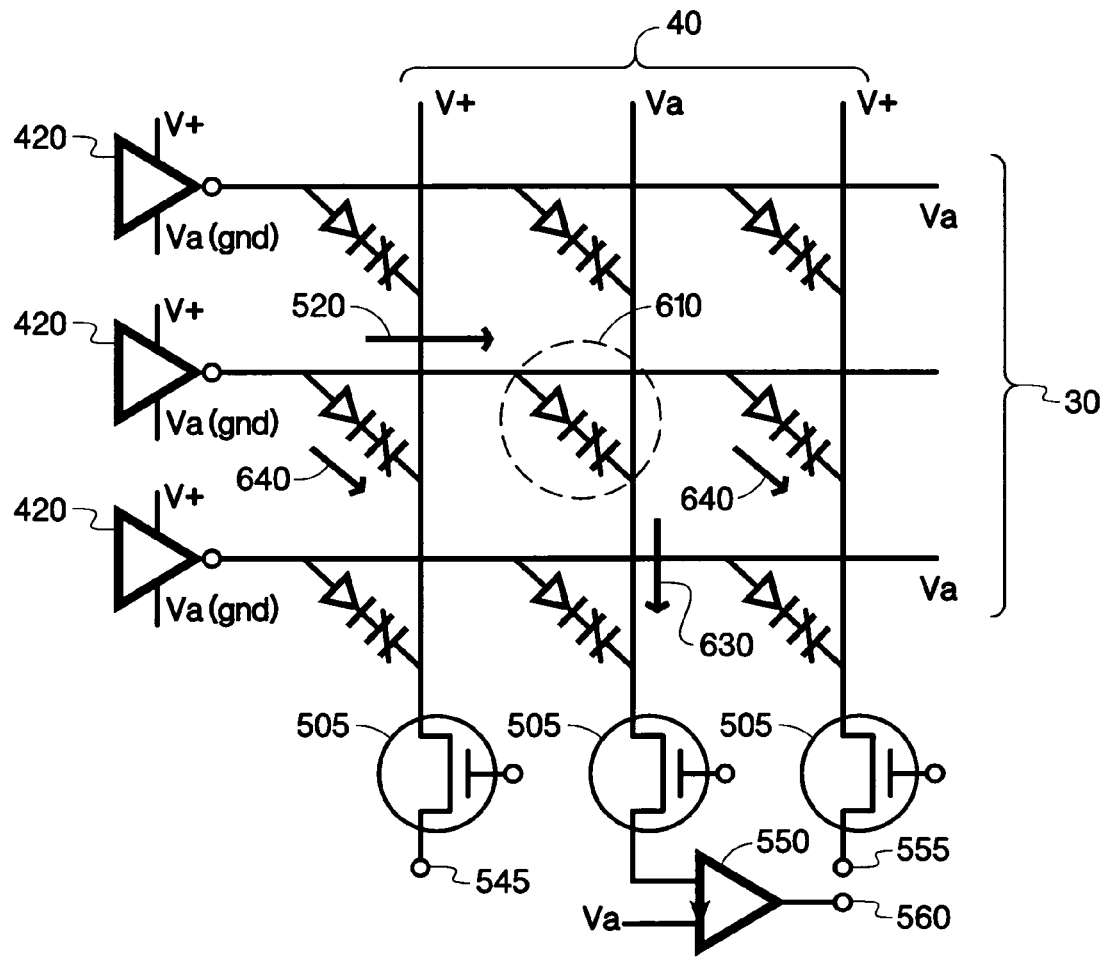
FIG. 15 is a simplified schematic diagram of an embodiment of a memory array, illustrating a read operation.

FIG. 15 is a simplified schematic diagram of an embodiment of a memory array corresponding to FIG. 14, but illustrating a read operation. In FIG. 15, the state of cell 610 is being read. Arrow 520 represents row current for the row of that cell. Arrow 630 represents read current. The two arrows 640 represent current in cells of cross-points adjacent to cell 610 in the same row (e.g., about one nanoampere). FET devices 505 are again the column-select devices. Again, the unselected columns in this example are connected at 545 and 555 to their own sense amplifiers (not shown). Sense amplifier 550 is the sense amplifier corresponding to the cell being read. During a read operation, voltage V+ may be about one volt and voltage $V_a$ about 50 millivolts, for example. Depending on the state (ON or OFF) of cell 610 when the row and column for cell 610 are selected, read current 630 may be about ten microamperes for $I_{on}$ or about one microampere for $I_{off}$, for example. Those skilled in the art will recognize that, while these examples (illustrated by FIGS. 14 and 15) are representative of an array of about 1,000 rows and 1,000 columns using tunnel-junction storage elements, quantitative voltages and currents may differ for larger or smaller arrays and/or for arrays using other storage elements, such as chalcogenide state-change elements. The present invention should not be construed as being limited to memory arrays using any particular type of storage element, nor as being limited to memory arrays using voltages or currents similar to those in the examples described herein.

Another aspect of the invention is a memory cell including a storage element comprising a tunnel-junction anti-fuse, and including a control element coupled in series with the storage element, the control element comprising a patterned silicon-rich insulator and a tunnel junction. The patterned silicon-rich insulator of the control element injects current into the tunnel junction of the control element when the memory cell is selected and isolates the storage element when the memory cell is un-selected. Such memory cells, like all the memory cell embodiments described herein, may be combined in a memory array having a number of row conductors and a number of column conductors arranged to cross at cross-points, and the memory cell disposed at each cross-point.

Thus, another aspect of the invention is a memory array structure including a number of row conductors and a number of column conductors arranged to cross at cross-points and including a memory cell disposed at each cross-point, each memory cell having a storage element and a control element coupled in series between a row conductor and a column conductor, each storage element comprising a tunnel-junction anti-fuse, and each control element comprising a patterned silicon-rich insulator and a tunnel junction.

FABRICATION

Figure 16:
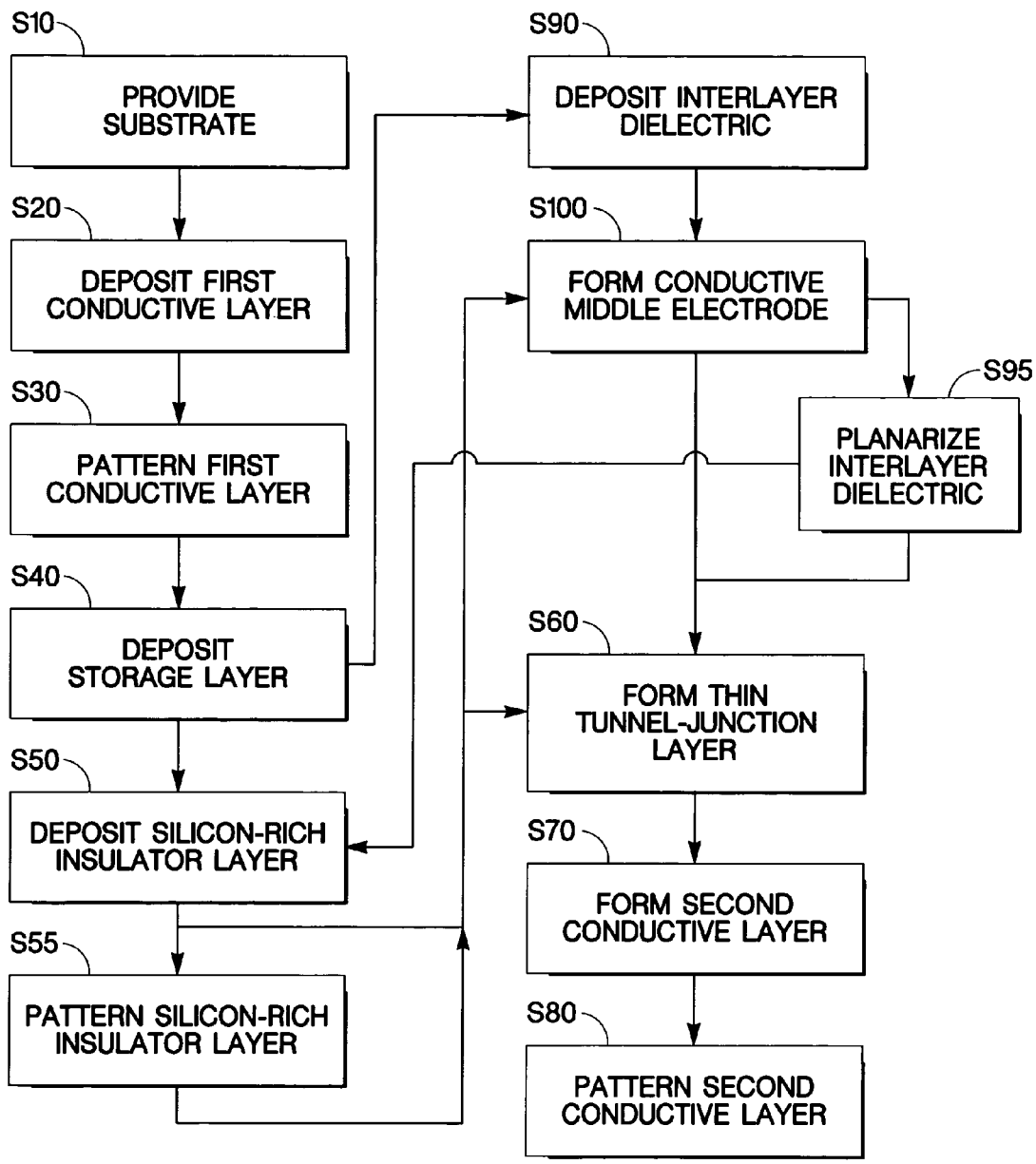
FIG. 16 is a flow chart illustrating an embodiment of a method for fabricating a memory array.

FIG. 16 is a flow chart illustrating an embodiment of a method for fabricating a memory array. Steps of this method embodiment are denoted by reference numerals S10, S20, . . . , S100. Some optional aspects of this method embodiment are indicated in the usual manner by alternative paths through the flowchart. If a substrate is used, a suitable substrate is provided in step S10. The substrate 300 (shown in FIG. 11) may be a wafer of P-type silicon suitable for CMOS circuit fabrication, for example. Those skilled in multi-layer memory integrated-circuit fabrication will recognize that the substrate for a particular layer of memory may be provided by a previous level (i.e., by an interlayer dielectric over the previous memory layer, for example) so that a separate substrate need not necessarily be provided for memory layers after the first layer. On the other hand, multi-layer memories may also be made by stacking multiple substrates, each carrying one or more memory-array layers.

In step S20, a first conductive layer is provided or deposited on the substrate. The first conductive layer is patterned if necessary in step S30 to form row conductors 30 or column conductors 40. A storage layer 50 is deposited in step S40. A layer of silicon-rich insulator 60 is formed in step S50, and patterned in step S55 if desired. Silicon-rich insulator layer 60 may comprise silicon-rich oxide (SRO), for example. In step S60, a thin tunnel-junction layer 70 is formed, contiguous with the layer of silicon-rich insulator 60. In step S70, a second conductive layer is formed, contiguous with the tunnel-junction layer. The second conductive layer is patterned in step S80 to form column conductors 40 or row conductors 30.

The step of depositing a thin silicon-rich oxide layer 60 may be performed by rapid thermal chemical vapor deposition (RTCVD) or by plasma-enhanced chemical vapor deposition (PECVD). In a PECVD process, for example, the plasma may be formed in a mixture of $N_2O$ and silane ($SiH_4$) gases at 650° C. and standard pressure. The deposition may be performed at 600° C., but at a higher pressure to achieve a reasonable deposition rate. The ratio of $SiH_4$ gas to $N_2O$ gas is regulated to control the silicon content while depositing an oxide $SiO_x$ where x is less than two. The deposited silicon-rich oxide layer 60 has a composition which, alternatively, may be characterized by an elemental molar ratio of silicon to oxygen between about 0.51 and about one. In other words, the process is controlled to provide an oxide having "excess" silicon, i.e., silicon in excess of the amount required for stoichiometric silicon dioxide. For example, the ratio of $SiH_4$:$N_2O$ may be about 1:20 for about 1% excess silicon in the SRO. Typically, $SiH_4$:$N_2O$ ratios used are between about 1:10 for about 10% excess silicon and about 1:5 for about 50% excess silicon. The step of depositing a thin tunnel-junction insulator layer 70 may also be performed by rapid thermal chemical vapor deposition (RTCVD), by plasma-enhanced chemical vapor deposition (PECVD), or by atomic layer deposition (ALD) of $Al_2O_3$ or stoichiometric $SiO_2$.

For some embodiments, an interlayer dielectric (ILD) 120 is deposited (step S90). Metal oxide 140 may serve as a functional equivalent for the layer of interlayer dielectric (ILD) 120 in some embodiments, as shown in FIG. 8 and described in connection with that drawing.

Also, for some embodiments, a conductive middle electrode 130 is formed (step S100), contiguous with the layer of silicon-rich insulator 60. Formation of conductive electrode 130 may include patterning the electrode. If necessary, an additional step S95 of planarizing the interlayer dielectric (ILD) is performed, e.g., by chemical-mechanical polishing (CMP).

Those skilled in the art will recognize from study and comparison of FIGS. 1-9 and 11 that the order of the steps in this fabrication method may be varied according to the type of embodiments to be fabricated. FIG. 11 also shows that metallization layers for row and column conductors 30 and 40 may be alternated in a multilayer memory structure.

Dimensions L1-L8 shown in cross-section drawings, FIGS. 2-7 represent typical dimensional relationships. The actual dimensions achieved in practice depend on the lithographic technology employed, properties of the materials used, and other known factors. For example L1, L2, L3, and L4 may all be similar, less than about one micrometer, e.g., about 100 nanometers or less than 100 nanometers. L8 may be about an order of magnitude smaller than L1, L2, L3, or L4. The thickness L5 of storage layer 50 may be about 1-5 nanometers, for example. The effective thickness L6 of silicon-rich insulator layer 60 may be about 5-10 nanometers, for example. The thickness L7 of tunnel-junction layer 70 may be about 3-5 nanometers, for example. Tunnel-junction layer 70 (with thickness L7) may be thicker in memory cell embodiments made in accordance with the present invention than in otherwise similar memory cells without silicon-rich insulator layer 60. The additional thickness improves layer yield. Thus, comparable characteristics can be achieved with higher layer yield, thereby reducing fabrication costs.

Thus, a practical aspect of the invention is a method for fabricating a memory cell 20 and corresponding methods for fabricating memory arrays 10 containing a number of such cells. Such method, as described above, includes steps of providing a substrate 300, depositing and patterning a first conductive layer 30 or 40 over the substrate, forming a storage layer 50, forming a layer of silicon-rich insulator 60, forming a tunnel-junction layer 70 over the layer of silicon-rich insulator, and forming and patterning a second conductive layer 30 or 40 over the tunnel-junction layer 70. The method may also include steps of patterning the layer of silicon-rich insulator, depositing an interlayer dielectric (ILD) 120, planarizing the interlayer dielectric (ILD), forming a conductive middle electrode 130 contiguous with the layer of silicon-rich insulator and/or contiguous with storage layer 50, and patterning the conductive middle electrode 130. In one embodiment of such methods, the interlayer dielectric 120 is formed over storage layer 50 and patterned, an opening is formed through the interlayer dielectric and extending to the storage layer 50, and the opening through the interlayer dielectric is filled with conductive material to form a middle electrode 130 contiguous with the storage layer 50. In some embodiments, middle electrode 130 is formed contiguous with the layer of silicon-rich insulator 60.

The thin layer of insulator of the tunnel junction 70 may be a thin layer of aluminum oxide ($Al_2O_3$), silicon dioxide ($SiO_2$), silicon oxynitride, or other high-dielectric-constant (high-K) material, for example. Both the conductive row and column conductors 30 and 40 and the middle electrode 130 may comprise any of a number of conductive materials, such as titanium or titanium nitride (TiN). Other conductive materials suitable for the conductive elements include aluminum, tungsten, gold, platinum, and other metals, and semiconductors such as silicon (e.g., crystalline, polycrystalline, microcrystalline, amorphous, or doped semiconductors).

For a memory array comprising many cells in one layer, all the cells may be made simultaneously with their interconnections provided in the row-conductor and column-conductor metallization layers. For a multi-layer memory array, a first layer may be made by this fabrication method and then the method may be repeated for subsequent layers with an interlayer dielectric between layers, each layer providing the substrate for the next layer. Conductive vias are used to interconnect memory layers. Thus, such a multilayer memory comprises a number of memory arrays arranged in memory layers with a number of interlayer dielectrics disposed to separate adjacent memory layers and with conductive vias selectively extending through the interlayer dielectrics to selectively interconnect memory cells of the memory arrays.

The memory cells of the multilayer memory may be organized in sets with the memory cells of each set at least partially aligned vertically with each other. The conductive vias interconnecting memory cells of each set may be interconnected electrically to form a common node for that set of memory cells. These conductive vias, interconnecting memory cells of each set, are at least partially aligned vertically, thus providing a vertical interconnection or pillar.

Another aspect of the invention is a method of controlling a memory cell of the type having an anti-fuse storage element. This method includes providing a patterned silicon-rich insulator combined with a tunnel junction to form a control element, whereby the memory cell is isolated when un-selected, coupling the control element in series with the anti-fuse storage element, and providing conductive elements for supplying current to selectively inject current from the silicon-rich insulator into the tunnel junction of the control element when selecting the memory cell. The memory cell structural embodiments and memory array structural embodiments described above are specially adapted to use this method of control, and the fabrication methods described above are specially adapted to make such memory cells and memory arrays.

INDUSTRIAL APPLICABILITY

Devices made in accordance with the invention are useful in storage devices and have lower power requirements and larger subarray sizes than many memory devices available heretofore. They may be used in many applications that require storage of data, especially for storing large amounts of data. These include applications in which the data may be written once, but must be read many times. The fabrication methods performed in accordance with the invention are specially adapted for making the devices described herein, with high yield and reduced cost through use of a minimal number of masks and through avoidance of very large driver devices.

Although the foregoing has been a description and illustration of specific embodiments of the invention, various modifications and changes thereto can be made by persons skilled in the art without departing from the scope and spirit of the invention as defined by the following claims. For example, as mentioned above, the order of method steps may be varied to some extent. Specifically, for example, either the row conductors or column conductors may be deposited first on the substrate, and the order of steps is therefore varied in those two cases. Other functionally equivalent materials may be substituted for the specific materials described in the example embodiments. Specifically, current-injecting materials other than silicon-rich oxide (SRO) may be employed.

What is claimed is:

1. A memory array comprising:
   a) a multiplicity of row conductors and a multiplicity of column conductors, the row conductors and column conductors being arranged to cross at cross-points, and
   b) a memory cell disposed at each cross-point, each memory cell having exactly two terminals and having a storage element and a control element coupled in series between a row conductor and a column conductor, each storage element comprising a low-resistance filament disposed therein, each control element including a tunnel junction and a silicon-rich insulator, wherein the low-resistance filament of the storage element electrically interconnects the silicon-rich insulator with one of the row conductor and the column conductor, and wherein the silicon-rich insulator injects current into the tunnel junction when the memory cell is selected.

2. The memory array of claim 1, wherein the silicon-rich insulator of each memory cell is patterned.

3. The memory array of claim 1, wherein the silicon-rich insulator of each memory cell comprises silicon-rich oxide (SRO).

4. The memory array of claim 1, wherein the silicon-rich insulator of each memory cell is electrically isolated from the silicon-rich insulators of all other memory cells.

5. The memory array of claim 1, wherein the control element of each memory cell further comprises a tunnel junction thickness of about 3-5 nanometers.

6. The memory array of claim 1, wherein the storage element of each memory cell comprises an anti-fuse.

7. The memory array of claim 1, wherein the storage element of each memory cell comprises a tunnel junction.

8. The memory array of claim 1, wherein the storage element of each memory cell comprises a state-change layer.

9. The memory array of claim 8, wherein the state-change layer of the storage element comprises a chalcogenide.

10. The memory array of claim 1, wherein the row conductors are arranged in mutually orthogonal relationship with the column conductors.

11. The memory array of claim 1, wherein the two terminals of the two-terminal memory cell disposed at each cross-point comprise the row conductor and column conductor respectively.

12. A memory array comprising:
   a) a multiplicity of row conductors and a multiplicity of column conductors, the row conductors and column conductors being arranged to cross at cross-points, and
   b) a memory cell disposed at each cross-point, each memory cell having exactly two terminals, each memory cell comprising means for storing data and means for controlling the means for storing data, the means for storing data and means for controlling being coupled in series between a row conductor and a column conductor, each means for storing data comprising a low-resistance filament disposed therein, each means for controlling including a tunnel junction and a silicon-rich insulator, wherein the low-resistance filament of the storage element electrically interconnects the silicon-rich insulator with one of the row conductor and the column conductor, and wherein the silicon-rich insulator injects current into the tunnel junction when the memory cell is selected.

13. The memory array of claim 12, wherein the two terminals of the two-terminal memory cell disposed at each cross-point comprise the row conductor and column conductor respectively.

14. A memory cell made by a method comprising:
   a) providing a substrate,
   b) depositing and patterning a first conductive layer over the substrate,
   c) forming a storage layer over the patterned first conductive layer, the storage layer comprising a low-resistance filament disposed therein,
   d) forming a layer of silicon-rich insulator over the storage layer,
   e) forming a tunnel-junction layer over the layer of silicon-rich insulator, and
   f) forming and patterning a second conductive layer over the tunnel-junction layer, whereby a memory-cell stack is formed, the stack having a storage layer, a silicon-rich insulator, and a tunnel-junction layer in series relationship between the first and second conductive layers, such that the first and second conductive layers are adapted to provide exactly two terminals for control of the memory cell, wherein the low-resistance filament of the storage layer electrically interconnects the layer of silicon-rich insulator with the first conductive layer, and wherein the silicon-rich insulator injects current into the tunnel-junction layer when the memory cell is selected.

15. A memory array comprising a multiplicity of memory cells made by the method of claim 14.

16. A substrate carrying electronics comprising the memory array of claim 15.

17. An integrated circuit comprising the memory array of claim 15.

18. A multilayer memory comprising:
   a) a multiplicity of the memory arrays of claim 15, arranged in memory layers,
   b) a multiplicity of interlayer dielectrics disposed to separate adjacent memory layers, and
   c) conductive vias selectively extending through the interlayer dielectrics to selectively interconnect memory cells of the memory arrays.

19. A substrate carrying electronics comprising the multilayer memory of claim 18.

20. An integrated circuit comprising the multilayer memory of claim 18.

21. The multilayer memory of claim 18, wherein the memory cells of the multilayer memory are organized in sets, the memory cells of each set being disposed to overlay vertically at least a portion of an adjacent set, whereby some portion of the memory cells of each set are aligned vertically with each other.

22. A memory cell made by a method comprising:
   a) providing a substrate,
   b) depositing and patterning a first conductive layer over the substrate,
   c) forming a storage layer over the patterned first conductive layer, said storage layer comprising a low-resistance filament disposed therein,
   d) forming a layer of silicon-rich insulator over the storage layer,
   e) forming a tunnel-junction layer over the layer of silicon-rich insulator,
   f) forming and patterning a second conductive layer over the tunnel-junction layer,
   g) forming and patterning an interlayer dielectric over the storage layer,
   h) forming an opening through the interlayer dielectric and extending to the storage layer, and
   i) filling the opening through the interlayer dielectric with conductive material to form a middle electrode contiguous with the storage layer, wherein the first and second conductive layers are adapted to provide exactly two terminals for control of the memory cell, and wherein the low-resistance filament of the storage layer electrically interconnects the silicon-rich insulator with the first conductive layer, and wherein the silicon-rich insulator injects current into the tunnel-junction layer when the memory cell is selected.

23. A memory array comprising a multiplicity of memory cells made by the method of claim 22.

24. A substrate carrying electronics comprising the memory array of claim 23.

25. An integrated circuit comprising the memory array of claim 23.

26. A multilayer memory made by a method comprising:
   a) providing a substrate,
   b) depositing and patterning a first conductive layer over the substrate,
   c) forming a storage layer over the patterned first conductive layer, said storage layer comprising a low-resistance filament disposed therein,
   d) forming and patterning a first interlayer dielectric over the storage layer,
   e) forming an opening through the first interlayer dielectric and extending to the storage layer,
   f) filling the opening through the first interlayer dielectric with conductive material to form a middle electrode, said middle electrode being electrically coupled to said first conductive layer through said low-resistance filament of said storage layer,
   g) forming a layer of silicon-rich insulator over at least the first interlayer dielectric, at least a portion of the silicon-rich insulator being disposed contiguous with the middle electrode,
   h) forming a tunnel-junction layer over the layer of silicon-rich insulator,
   i) forming and patterning a second conductive layer over the tunnel-junction layer and disposed to overlay vertically at least a portion of the middle electrode, whereby a portion of the second conductive layer is aligned with some portion of the middle electrode, and wherein the first and second conductive layers are adapted to provide exactly two terminals for control of a memory cell, and wherein the silicon-rich insulator injects current into the tunnel-junction layer when the memory cell is selected,
   j) forming and patterning a second interlayer dielectric over the patterned second conductive layer, whereby a substrate is formed for subsequent layers,
   k) forming vias as required through the second interlayer dielectric, and
   l) repeating steps b) through k) until a desired number of memory array layers have been formed.

27. A substrate carrying electronics comprising the multilayer memory made by the method of claim 26.

28. An integrated circuit comprising the multilayer memory made by the method of claim 26.

29. A multilayer memory made by a method comprising:
   a) providing a substrate,
   b) depositing and patterning a first conductive layer over the substrate,
   c) forming a tunnel-junction layer over the first conductive layer,
   d) forming a layer of silicon-rich insulator over the tunnel-junction layer,
   e) forming and patterning a first interlayer dielectric over the layer of silicon-rich insulator,
   f) forming an opening through the first interlayer dielectric and extending to the layer of silicon-rich insulator,
   g) filling the opening through the first interlayer dielectric with conductive material to form a middle electrode, at least a portion of the middle electrode being disposed contiguous with the silicon-rich insulator,
   h) forming a storage-element layer over the patterned first interlayer dielectric, said storage-element layer comprising a low-resistance filament disposed therein,
   i) forming and patterning a second conductive layer over the storage-element layer, the patterned second conductive layer being disposed to overlay vertically at least a portion of the middle electrode, such that a portion of the second conductive layer is aligned with some portion of the middle electrode, wherein the low-resistance filament of the storage element electrically interconnects the layer of silicon-rich insulator with the middle electrode, and wherein the first and second conductive layers are adapted to provide exactly two terminals for control of a memory cell, and wherein the silicon-rich insulator injects current into the tunnel-junction layer when the memory cell is selected, j) forming and patterning a second interlayer dielectric over the patterned second conductive layer, whereby a substrate is formed for subsequent layers, k) forming vias as required through the second interlayer dielectric, and l) repeating steps b) through k) until a desired number of memory array layers have been formed.

30. A substrate carrying electronics comprising the multilayer memory made by the method of claim 29.

31. An integrated circuit comprising the multilayer memory made by the method of claim 29.

* * * * *